United States Patent [19]
Bonham et al.

[11] Patent Number: 5,527,655
[45] Date of Patent: Jun. 18, 1996

[54] RADIATION-SENSITIVE ADDUCTS COMPRISING DIAZONIUM CATIONS, QUATERNARY CATIONS, AND SULFONATED POLYESTER ANIONS

[75] Inventors: James A. Bonham, Grant Township, Washington County; Leonard J. Stulc, Shafer Township, Chisago County; Richard J. Kuo, St. Paul, all of Minn.; Kimberly R. Kukla, Hudson Township, Croix County, Wis.

[73] Assignee: Minnesota Mining and Manufacturing Company, St. Paul, Minn.

[21] Appl. No.: 314,144

[22] Filed: Sep. 28, 1994

[51] Int. Cl.$^6$ .............................. G03C 1/54; G03C 1/56; G03F 7/021
[52] U.S. Cl. .......................... 430/175; 430/176; 525/339; 525/340; 525/378
[58] Field of Search ..................... 430/175, 176; 525/339, 340, 378

[56] References Cited

U.S. PATENT DOCUMENTS

| | | | |
|---|---|---|---|
| 4,299,907 | 11/1981 | Burkle et al. | 430/175 |
| 4,408,532 | 10/1983 | Incremona | 430/175 |
| 4,543,315 | 9/1985 | Lorenx et al. | 430/156 |
| 4,564,580 | 1/1986 | Ichimura et al. | 430/175 |
| 4,578,342 | 3/1986 | Sekiya | 430/159 |
| 5,120,799 | 6/1992 | Wade et al. | 525/353 |
| 5,200,291 | 4/1993 | Wanat | 430/163 |
| 5,223,376 | 6/1993 | Hasegawa et al. | 430/326 |
| 5,308,735 | 5/1994 | Kanda et al. | 430/175 |

FOREIGN PATENT DOCUMENTS 06236029  2/1993  Japan .

*Primary Examiner*—Susan W. Berman
*Attorney, Agent, or Firm*—Gary L. Griswold; Walter N. Kirn; Arlene K. Musser

[57] ABSTRACT

Radiation-sensitive polymeric adducts of (1) a sulfonated polyester resin having a plurality of sulfonate groups, (2) a diazonium resin having a plurality of diazonium groups, and (3) a salt of quaternary ammonium or quaternary phosphonium. This invention also provides a radiation-sensitive article comprising a substrate bearing a coating containing a radiation-sensitive adduct.

30 Claims, No Drawings

RADIATION-SENSITIVE ADDUCTS COMPRISING DIAZONIUM CATIONS, QUATERNARY CATIONS, AND SULFONATED POLYESTER ANIONS

FIELD OF THE INVENTION

This invention relates to radiation-sensitive adducts, in particular, to a radiation-sensitive polyelectrolyte complex comprising three ingredients: (a) a diazonium resin having a plurality of diazonium groups, (b) a sulfonated polyester resin having a plurality of sulfonate groups, and (c) a quaternary ammonium or phosphonium cation. This invention also relates to radiation-sensitive coatings and presensitized lithographic plates containing the radiation-sensitive adduct.

DISCUSSION OF THE ART

Lithographic plates (also called lithoplates or printing plates) are sheet-like articles with metal, paper, or plastic substrates that have been cleaned, treated, or coated with a thin film of radiation- or light-sensitive material. This radiation-sensitive material, which is typically a diazonium resin, is naturally soluble in some solvents such as water or halogenated organic compounds, but becomes insoluble after it is dried and exposed to light. A latent photoimage is produced on the plate by placing a negative or positive image on a film in close contact with the coated plate and then exposing the plate to a controlled light or radiation source such as ultraviolet light. The light passes through the positive or negative, thereby photoinsolubilizing the portions of the coating exposed to light. The portions of the coating which remain shaded by the opaque portions of the negative or positive image remain soluble. Afterwards, the plate is usually developed in an aqueous developing solution.

Diazonium resins are well known and widely used to impart light sensitivity to negative-acting lithographic plates and photoresist coatings. When exposed to actinic radiation, the diazonium resin decomposes and produces physical and chemical changes such as crosslinking, insolubility, increased adhesion, etc.

Diazonium resins that are most widely used are the condensation products of 4-diazodiphenylamine and a carbonyl compound such as formaldehyde, as described in U.S. Pat. No. 2,714,066. The anion associated with the diazonium group in these compounds is usually selected to impart either water or organic solvent solubility to the diazonium resin. For example, water soluble diazonium resins normally have an anion group of a mineral acid or a zinc chloride complex salt. Diazonium resins soluble in organic solvents employ organic anions such as carboxylate groups and sulfonate groups. Other examples of diazonium resins are described in U.S. Pat. Nos. 4,284,705; 4,436,804; 4,661,432; 4,731,316; 4,902,601; 5,009,981; and U.S. Pat. No. 5,112,743. Photosensitive diazonium compounds having a quaternary ammonium group in the resin backbone are described in U.S. Pat. No. 5,308,735.

In a light-sensitive layer for use in a presensitized lithographic plate, the diazonium resin may be used in many ways. It can be used by itself, as described in U.S. Pat. No. 2,714,066; it can be overcoated with a resinous layer, as described in U.S. Pat. No. 3,136,637; it can be overcoated with a photopolymer, as described in U.S. Pat. No. 3,905,815; or it can be mixed within a photopolymerizable layer, as described in U.S. Pat. No. 5,143,813. However, most of the presensitized lithographic plates manufactured today employ a mixture of a diazonium resin with a polymeric binder. The selection of the polymeric binder is important in order to achieve good lithographic plate performance. Examples of diazonium resin/polymeric binder compositions are disclosed in U.S. Pat. Nos. 3,847,614; 4,284,705; 4,337,307; 4,539,285; 4,631,245; 4,929,533; 4,940,646; 5,169,897; 5,169,898; 5,242,779; 5,272,035; 5,275,097; and U.S. Pat. No. 5,300,397. The processes required for the manufacture of these polymeric binders are complicated and difficult to control. In addition, coating compositions containing these polymeric binders may require complex blends of solvents, as described in U.S. Pat. No. 4,917,988 and U.S. Pat. No. 5,302,487.

Quaternary ammonium salts have been used as surfactants to impart water solubility to light sensitive compositions of diazonium resins, as described in U.S. Pat. No. 4,801,519. In addition, quaternary ammonium salts have also been used as development inhibitors (see U.S. Pat. No. 4,792,516), as cationic emulsifiers in latex coating compositions (see U.S. Pat. No. 4,568,628), and as interlayers between a sealing layer and coating composition containing a diazonium resin. Quaternary ammonium salts have also been used in developer compositions for coatings containing diazonium resins, as described in U.S. Pat. No. 4,801,519 and U.S. Pat. No. 4,628,023.

Certain types of radiation sensitive compounds have monomeric diazonium cations associated with anionic counterions that are attached to a polymer, as described in U.S. Pat. No. 5,200,291. Because the diazonium cation is monomeric, the radiation sensitive compound does not crosslink or insolubilize to a sufficient extent upon exposure to radiation,, and a post heating step is required to achieve good press performance.

In U.S. Pat. No. 5,120,799 and U.S. Pat. No. 5,278,022, polymeric compounds having pendent sulfonate groups are derived from a polyhydric polymer by reaction, for example, with 2-sulfobenzoic acid cyclic anhydride. A wide range of cationic counterions, including quaternary compounds and diazonium compounds, may be employed, either in combination or individually. These particular sulfonated polymers require complex manufacturing processes, toxic reagents, solvents, and several isolation steps. These materials also suffer from problems of incompatibility, poor ink receptivity, and contain significant amounts of contaminants, which are produced during their manufacture. Furthermore, to overcome these deficiencies, the polymers of U.S. Pat. No. 5,120,799 and U.S. Pat. No. 5,278,022 must be further reacted with alkyl isocyanates to produce the necessary compatibility with diazonium resins and to remove contaminants. See U.S. Pat. No. 5,162,431. Furthermore, the preferred coating solvent for these polymeric compounds is ethylene glycol monomethyl ether, a solvent of good dissolving power, but one that is known to have harmful effects. Expensive safety precautions are necessary where coating is carried out.

U.S. Pat. No. 4,543,315 and U.S. Pat. No. 4,401,743 disclose radiation sensitive materials that are the adducts of a diazonium resin having a plurality of diazonium groups and a polyester or polyurethane resin having a plurality of sulfonate groups. Unlike the other sulfonated adducts discussed above, the sulfonated polyester precursors used to form the adducts are easily prepared in one step, without solvent, and in nearly quantitative yields. The formation of their adducts with diazonium resins is performed in aqueous alcohol solutions in nearly quantitative yield and isolated by simple precipitation and filtration. These materials can be used to manufacture presensitized lithographic plates that are processable in simple aqueous developers, while continuing to exhibit good printing characteristics.

Furthermore, adducts of this type are soluble in simple ketone coating solvents, such as methyl ethyl ketone, which is preferred for the manufacture of presensitized plates for environmental and solvent recovery reasons. However, it was found that in order to achieve the desired solubility in the methyl ethyl ketone coating solvent, the range of components, i.e., the diacid and diol monomers capable of preparing these sulfonated polyester resins, was limited in scope. The use of less preferred monomers resulted in diminished chemical resistance of the exposed radiation-sensitive coating to certain press chemicals and press washes.

Therefore, it would be desirable to provide diazonium resin/sulfonated polyester adducts derived from a wider range of sulfonated polyester polymer structures, but that can still be dissolved in simple, environmentally acceptable coating solvents, such as methyl ethyl ketone.

It would also be desirable to provide a method of preparing diazonium resin/sulfonated polyester adducts in nearly quantitative yields with a minimum amount of isolation steps in their manufacture and in the manufacture of radiation sensitive compositions and articles containing these compositions.

It would also be desirable to provide adducts having improved resistance to solvents, commonly referred to as press washes, fountains, plate cleaners, etc., used in printing operations.

SUMMARY OF THE INVENTION

This invention provides radiation-sensitive polymeric adducts of (1) a sulfonated polyester resin having a plurality of sulfonate groups, (2) a diazonium resin having a plurality of diazonium groups, and (3) a salt of quaternary ammonium or quaternary phosphonium. This invention also provides a radiation-sensitive article comprising a substrate bearing a coating of the adduct.

In one embodiment, the compounds of this invention are adducts comprising:

1) a sulfonated polyester resin having a plurality of sulfonate groups, said polyester resin having a $T_g$ of from about 25° C. to about 100° C. and a sulfonate equivalent weight of from about 1,500 to about 4,000, 2) a diazonium resin having a plurality of diazonium groups, 3) a tetrasubstituted quaternary ammonium cation or a tetrasubstituted quaternary phosphonium cation, or both of the foregoing cations, wherein the substituents are selected from the group consisting of alkyl groups, aryl groups, aralkyl groups, alkaryl groups, and combinations of these groups, and 4) an acid anion (e.g., the anion of an inorganic acid or an organic acid). These adducts can be represented by the empirical formula:

$[R_1(SO_3^-)_n][Q^+][R_2(N_2^+)_m][X^-]$ wherein $R_1$ represents a polyester resin backbone, $R_2$ represents a polymeric backbone, $Q^+$ represents a tetrasubstituted quaternary ammonium or tetrasubstituted phosphonium cation, $X^-$ represents an acid anion, m represents a number equal to or greater than 2, and n represents a number equal to or greater than 2, and the $N_2^+$ cations are associated with the $SO_3^-$ anions, the $Q^+$ cations are associated with the $SO_3^-$ anions, and the $X^-$ anions are associated with the $N_2^+$ cations.

These adducts can be schematically represented by the following formula:

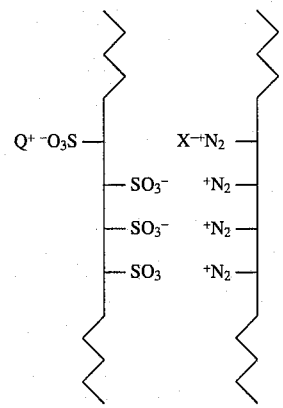

Formula I

In a second embodiment, the compounds of this invention are adducts comprising:

1) a sulfonated polyester resin having a plurality of sulfonate groups, said polyester resin having a $T_g$ of from about 25° C. to about 100° C. and a sulfonate equivalent weight of from about 1,500 to about 4,000, 2) a diazonium resin having a plurality of diazonium groups, and 3) a tetrasubstituted quaternary ammonium cation or a tetrasubstituted quaternary phosphonium cation, or both of the foregoing cations, wherein the substituents are selected from the group consisting of alkyl groups, aryl groups, aralkyl groups, alkaryl groups, and combinations of these groups.

There adducts can be represented by the empirical formula:

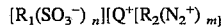

$[R_1(SO_3^-)_n][Q^+[R_2(N_2^+)_m]$ wherein $R_1$, $R_2$, $Q^+$, m, and n are as previously defined, and the $N_2^+$ cations are associated with the $SO_3^-$ anions, and the $Q^+$ cations are associated with the $SO_2^-$ anions.

These adducts can be schematically represented by the following formula:

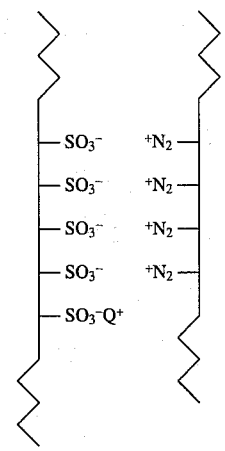

Formula II

In a third embodiment, the compounds of this invention are adducts comprising:

1) a sulfonated polyester resin having a plurality of sulfonate groups, said polyester resin having a $T_g$ of from about 25° C. to about 100° C. and a sulfonate equivalent weight of from about 1,500 to about 4,000, 2) a diazonium resin having a plurality of diazonium groups,
3) a tetrasubstituted quaternary ammonium cation or a tetrasubstituted quaternary phosphonium cation, or both of the foregoing cations, wherein the substituents are selected from the group consisting of alkyl groups, aryl groups, aralkyl groups, alkaryl groups, and combinations of these groups, and
4) an alkali metal cation.

The adducts can be represented by the empirical formula:

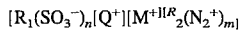

wherein $R_2$, $R_2$, $Q^+$, m, and n are as previously defined, $M^+$ represents an alkali metal cation, and the $N_2^+$ cations are associated with the $SO_3^-$ anions, the $Q^+$ cations are associated with the $SO_3^-$ anions, and the $M^+$ cations are associated with the $SO_3^-$ anions.

These adducts can be schematically represented by the following formula:

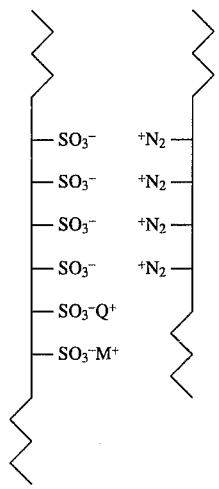

Formula III

The compounds of the present invention can be used in compositions for lithographic printing plates. The compositions will result in lithographic plates that will exhibit improved performance latitude, good shelf life, and easy processing. These compositions also result in longer machine developer usage, less machine developer sludge, decreased background staining, and excellent resistance to ink toning and solvents.

These compounds are also more versatile than compounds of the prior art in that a wider selection of radiation-sensitive structures and coating compositions are available to achieve optimum performance.

DETAILED DESCRIPTION OF THE INVENTION

As used herein, and as generally known in the art, the term "diazonium resin" refers to a material having more than one (i.e., a plurality) of diazonium groups per molecule. In general, these materials comprise a mixture of oligomers. As used herein, the terms "sulfonated polyester", "sulfopolyester", and the like refer to an amorphous polyester having a plurality of sulfonate groups. These sulfonated polyesters are usually derived from aromatic diacids having a sulfonate group ($-SO_3^-$). As used herein, the term "adduct" refers to a compound that is a polyelectrolyte complex having the diazonium cations of a diazonium resin associated with the sulfonate anions of a sulfonated polyester. As used herein, the expression "1:1 diazonium resin/sulfonated polyester adduct" refers to a polyelectrolyte complex having stoichiometric amounts of a diazonium resin cation and a sulfonated polyester anion. In the adducts of Formula I, Formula II, and Formula III of the present invention, the polyelectrolyte complex comprises both (a) diazonium cations of a diazonium resin and (b) quaternary ammonium cations or quaternary phosphonium cations associated with the sulfonate anions of a sulfonated polyester. In the adducts of Formula I, acid anions are also associated with the diazonium cations. In the adducts of Formula III, alkali metal cations are also associated with the sulfonate anions.

The compound having Formula I is the reaction product of Equation 1:

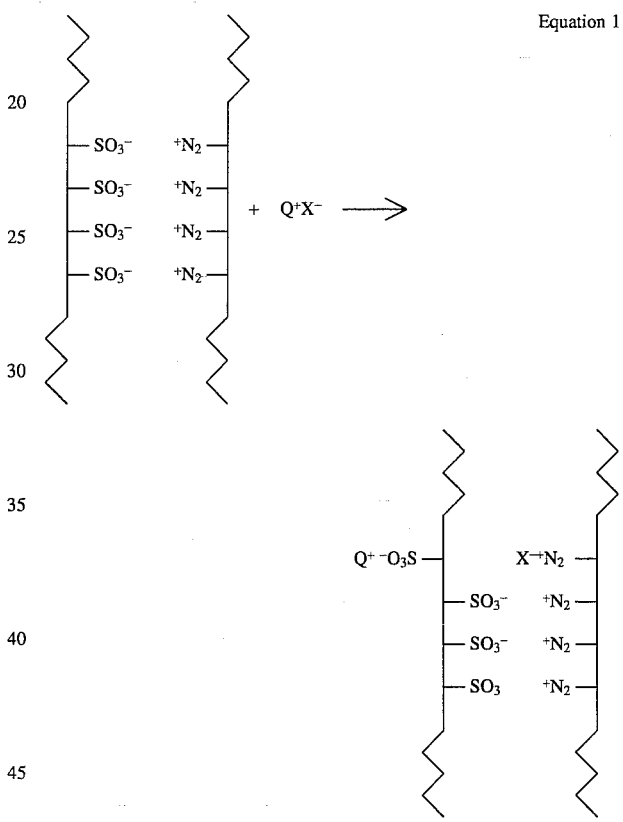

The compound having Formula II is the reaction product of Equation 2:

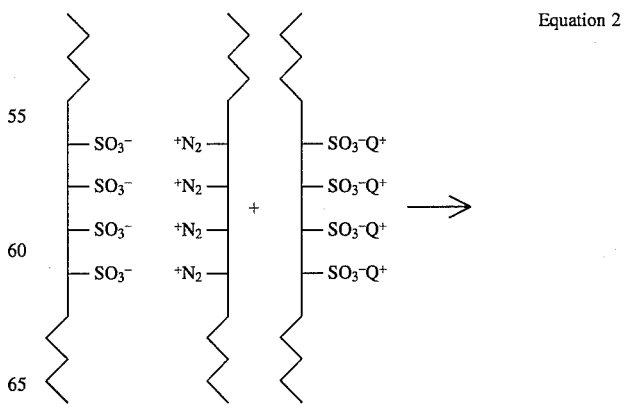

-continued

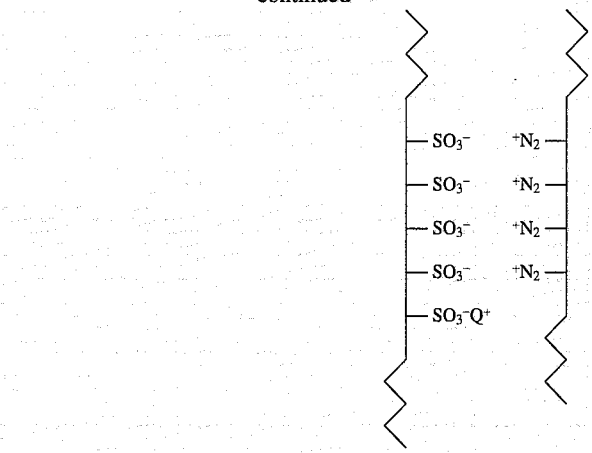

The compound having Formula III is the reaction product of Equation 3:

Equation 3

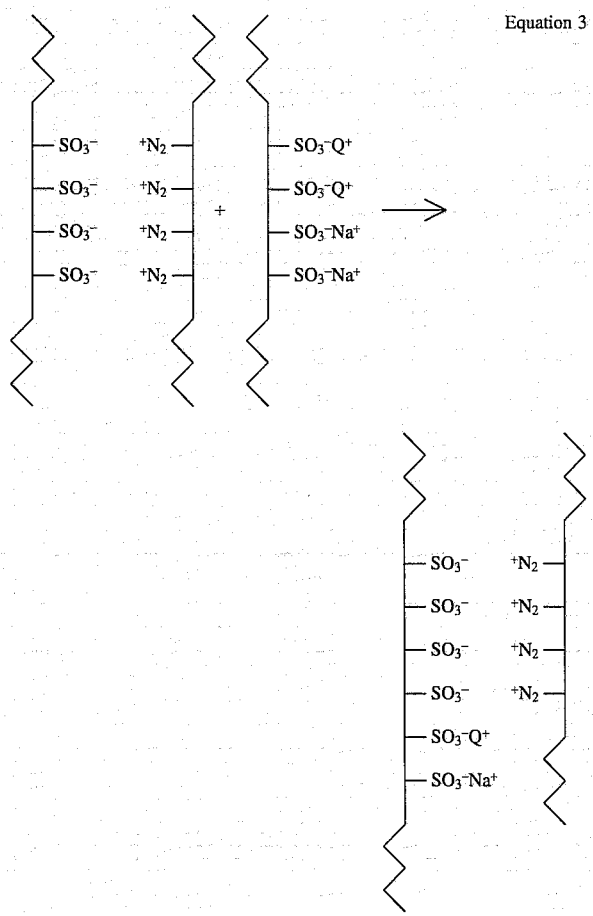

The reaction products of Equations 1, 2, and 3, i.e., the compounds having Formula I, Formula II, and Formula III, respectively, can be described as polyelectrolyte complexes of macromolecules having groups that have opposite charge. The compounds having Formula I, Formula II, and Formula III can be considered derivatives of a stoichiometric polyelectrolyte complex. For example, the compound of Formula I can be prepared by reacting the stoichiometric polyelectrolyte complex referred to herein as a 1:1 diazonium resin/sulfonated polyester adduct with a quaternary salt, $Q^+X^-$, as represented in Equation 1. In this reaction the association between some diazonium cation groups and sulfonate anion groups is disrupted and a reassociation occurs in which the cation and anion of the quaternary salt are introduced into the complex by association with some of the sulfonate anions and diazonium cations. The formation of compounds having Formula II and Formula III are represented in Equation 2 and Equation 3, respectively. These compounds differ from that of Formula I in that the cations of the quaternary salt are introduced into the polyelectrolyte complex by means of a quaternary salt of a sulfonated polyester. The reaction products of Equations 1–3 are, of course, considered simple representations of the compounds of this invention. The exact molecular structures and configurations of these compounds are very complicated because both the diazonium resin cations and sulfonated polyesters comprise mixtures of oligomers and polymers having chains with differing chain lengths as well as differing degrees of diazonium and sulfonate substitution. A general discussion of polyelectrolyte complexes is described in A. D. Wilson and H. J. Prosser, *Developments in Ionic Polymers*—2, Elsevier Applied Science Publishers (New York, 1986), Chapter 5.

In the compounds of Formula I, Formula II, and Formula III, the cationic and anionic counterions are equilibrated throughout the composition. The compounds of Formula I, Formula II, and Formula III are very stable, and they can be isolated.

The compounds of the invention having Formula I can be prepared by the reaction shown in Equation 1 by reacting a 1:1 diazonium resin/sulfonated polyester adduct with a quaternary ammonium or phosphonium cation. In a preferred method, the 1:1 diazonium resin/sulfonated polyester adduct used in Equation 1 is first prepared by reacting one equivalent of an alkali metal salt of a sulfonated polyester resin with one equivalent of diazonium resin, as described in U.S. Pat. Nos. 4,543,315; 4,401,743; and EP 0,462,704. This reaction is typically performed in a solvent from which the 1:1 diazonium resin/sulfonated polyester adduct precipitates in nearly quantitative yield and can be isolated by filtration. The alkali metal ions of the sulfonated polyester, the counterions of the diazonium resin, and any excess diazonium resin are removed in the filtrate. This 1:1 diazonium resin/sulfonated polyester adduct is then reacted with a quaternary ammonium or phosphonium salt. The reaction is carried out by dissolving or dispersing the reactants at room temperature with stirring in an organic solvent. The preferred organic solvent is methyl ethyl ketone. Other solvents, such as methylene chloride, ethylene dichloride, ethyl acetate, acetone, etc., can be used. As the cations and anions of the quaternary salt equilibrate with the diazonium and sulfonate ions, the compounds having Formula I are formed in nearly quantitative yield within a few minutes to a few hours. The 1:1 diazonium resin/sulfonated polyester adduct reactant need not be soluble in the methyl ethyl ketone solvent because the compound of Formula I dissolves as the equilibration reaction occurs. The compounds of Formula I can be isolated if desired by precipitation with a cosolvent in which it is insoluble, e.g., hexane or diethyl ether, or by evaporation of the reaction solvent. However, this extra step is not necessary because the reaction solution often can be used to prepare radiation- sensitive coating compositions.

The compounds of the invention having Formula II and Formula III can be prepared by the reaction schemes of Equation 2 and Equation 3, respectively, by reacting a quaternary salt of a sulfonated polyester with the 1:1 diazonium resin/sulfonated polyester adduct described previously. The quaternary salts of the sulfonated polyester used in these reactions are prepared by completely or partially exchanging the metal cations of an alkali metal salt of a sulfonated polyester with a quaternary ammonium or quaternary phosphonium salt. The preferred solvent for this reaction is methyl ethyl ketone. As in the reaction for preparing the compound of Formula I, other solvents can be used. The alkali metal salt of the sulfonated polyester need not be soluble in methyl ethyl ketone, because, as the reaction proceeds, the quaternary salt product dissolves. In most of these reactions the alkali metal cation precipitates along with the anion of the quaternary salt and can be removed by filtration. The percentage of sulfonate equivalents normally converted to the quaternary salt is from about 10% to 100%. The quaternary salt of the sulfonated polyester can be isolated by precipitation with a cosolvent in which it is insoluble, such as hexane. However, it is preferred to use the reaction solution in subsequent reactions or in the preparation of coating compositions.

The compounds of Formula II can be prepared by reacting a full quaternary salt of a sulfonated polyester with a 1:1 diazonium resin/sulfonated polyester adduct by simply stirring them together for several hours to allow the counterions to equilibrate between the reactants. Methyl ethyl ketone is the preferred solvent; however, other solvents can be used. The compounds of Formula III can be prepared in the same manner as that used to prepare the compounds of Formula II, except that the 1:1 diazonium resin/sulfonated polyester adduct is reacted with a partial quaternary salt of the sulfonated polyester. As used herein, a "partial quaternary salt" is quaternary salt in which some alkali metal ion is not exchanged. Again the 1:1 diazonium resin/sulfonated polyester adduct need not be soluble in methyl ethyl ketone, because as the equilibration reaction proceeds, the compounds having Formula II or Formula III become soluble. The preferred percentage of the quaternary salt of the sulfonated polyester reactant employed in in the preparation of the compounds of Formula II or III corresponds to about 5 to 50% of the equivalents of the diazonium groups of the 1:1 diazonium resin/sulfonated polyester adduct coreactant. The yield of the reaction is essentially quantitative. It is not necessary to further isolate the products and, advantageously, the final reaction solution containing the compounds of the invention can be used directly in the preparation of radiation sensitive coatings.

The diazonium resin cations used in preparing the 1:1 diazonium resin/sulfonated polyester adduct and the adducts of the present invention are preferably derived from the condensation product of a 4-diazodiphenylamine with an active carbonyl compound. Typical diazonium monomers that can be used to form the diazonium resins are salts of 4-diazodiphenylamine, 3-methoxy-4-diazodiphenylamine, 2-methoxy-4-diazodiphenylamine, 4'-methoxy-4-diazodiphenylamine, 4'-ethyl-4-diazodiphenylamine, 2'-methoxy-4diazodiphenylamine, etc. Representative examples of carbonyl compounds that are suitable for the condensation reaction with diazonium monomers are formaldehyde, aliphatic aldehydes such as acetaldehyde, aromatic aldehydes such as benzaldehyde and substituted derivatives of benzaldehyde. The most preferred diazonium resin cations are the condensation product of 4-diazodiphenylamine and paraformaldehyde, as described in U.S. Pat. No. 2,714,066. These materials normally comprise a mixture of oligomers having an average diazonium equivalent weight of from about 301 to 363. These diazonium resins normally consist of a series of oligomers having about 70 to 75% being less than eight repeating units and 25 to 30% greater than eight repeating units.

Sulfonated polyesters that are useful for preparing the compounds of this invention are described in U.S. Pat. Nos. 4,480,085, 4,543,315; 4,401,743; and EP 0,462,704, all of which are incorporated herein by reference.

EP 0,462,704 describes sulfopolyesters which are the esterification reaction product of one or more dicarboxylic acids with ethylene glycol and/or a branched chain glycol. The term "sulfo", as used herein, is intended to embrace the group —$SO_3M$, in which M is an alkali metal cation such as sodium, potassium, and lithium. The glycols employed are ethylene glycol and at least one branched chain glycol, preferably neopentyl glycol. At least two dicarboxylic acids are utilized. They are independently chosen from the group consisting of sulfoarylene dicarboxylic acids such as 3sulfophthalic acid, 4-sulfophthalic acid, 5-sulfophthalic acid, sulfoterephthalic acid, 4-sulfonapthalene-2,7-dicarboxylic acid, 5.(4-sulfophenyl) isophthalic acid, 5-(4-sulfoisophthalic sulfophenoxy)isophthalic acid, 5-(2-sulfoethyl) isophthalic acid, and 5-sulfoisophthalic acid, with the latter preferred; alkyl or alkoxy substituted meta- or para- arylene dicarboxylic acids such as 5-methyl isophthalic acid, and 5-t-butyl isophthalic, with the latter preferred; unsubstituted, non-ortho- or non-para- substituted arylene dicarboxylic acids such as terephthalic acid, 2,6-naphalenedicarboxylic acid, 1,3-napthalenedicarboxylic acid, acid, 4-napthalenedicarboxylic 1,4napthalenedicarboxylic acid, and isophthalic acid, with the latter preferred; and aliphatic dicarboxylic acids such as adipic acid, succinic acid, glutamic acid, tetradecanedicarboxylic acid, 2,3-dimethyl-1,4-butanedicarboxylic acid, 1,4-cyclohexanedicarboxylic acid, 1,4-cyclohexanediacetic acid, and sebacic acid, with the latter preferred. The sulfopolyesters used in the adducts of have a molecular weight of from 5,000 to 50,000 and preferably from 30,000 to 0 50,000.

Generally the sulfonated polyesters can be prepared by conventional processes for preparing polyesters, e.g., by the coesterification of an aromatic diacid having a sulfonate group with at least one other aromatic dicarboxylic acid and one or more diols or glycols. The most preferred sulfonated diacid is sodium 5-sulfoisophthalic acid. Other aromatic dicarboxylic acids suitable as a co-reactant include isophthalic acid, terephthalic acid, 5-tert-butylisophthalic acid, 1,3-naphthylenedicarboxylic acid, adipic acid, succinic acid, and sebacic acid. Diols or glycols that can be used to prepare the sulfonated polyesters include aliphatic and cycloaliphatic diols, optionally containing aromatic groups, and low molecular weight polyoxyalkylene diols. Representative examples of these include ethylene glycol, butane diol, diethylene glycol, neopentyl glycol, polycaprolactone diol, and bis-(hydroxyethyl)terephthalate. The sulfonated polyesters suitable for preparing the compounds of the invention are amorphous, have a $T_g$ of from about 25 to about 100° C., and have an equivalent weight of from about 1500 to about 4000 grams per sulfonate. The average molecular weight of the sulfonated polyesters ranges from about 15,000 to about 50,000 as determined by gel permeation chromatography using silica-based columns, polymethylmethacrylate standards, and a mixed eluent consisting of 45% tetrahydrofuran, 45% acetonitrile, 10% water containing 2 g/l of lithium methanesulfonate. The most preferred molecular weight ranges from 30,000 to 40,000. Examples of solvents in which these sulfonated polyesters can be dissolved include mixtures of water and alcohol, dimethylformamide, tetrahydrofuran, methyl ethyl ketone, ethyl acetate, methylene chloride, and ethylene chloride.

The quaternary salts that can be used to prepare the compounds of this invention are quaternary ammonium and phosphonium salts substituted with alkyl, aryl, alkaryl, or aralkyl groups, or combinations of these groups. The molecular weight of the quaternary group can range from about 100 to about 600, and preferably ranges from about 200 to about 400. Particularly useful quaternary ammonium salts include tetraethylammonium bromide, tetraethylammonium chloride, tetraethylammonium p-toluenesulfonate, tetrapropylammonium bromide, tetraethylammonium bromide, tetrabutylammonium chloride, tetrabutylammonium acetate, tetrabutylammonium hexafluorophosphate, tetrabutylammonium p-toluenesulfonate, tetrabutylammonium hydrogen sulfate, tetrabutylammonium tetrafluoroborate, tetrabutylammonium tetraphenylborate, tetrahexylammonium bromide, tetraoctylammonium bromide, benzyltriethylammonium bromide, benzyltriethylammonium chloride, benzyltributylammonium bromide, benzyldimethylstearylammonium bromide, cetyltrimethylammonium bromide, etc. Particularly useful quaternary phosphonium salts include tetrabutylphosphonium bromide, tetrabutylphosphonium chloride, and benzyltriphenylphosphonium chloride. The anion associated with the quaternary salt is an acid anion and is typically a halide, e.g., chloride, bromide, an organic carboxylate, an organic sulfonate, a tetrafluoroborate, a hexafluoroantimonate, a hexafluorophosphonate, etc. Normally, an anion that is basic, such as hydroxide, is avoided, because it may cause decomposition of the diazonium salt. Also, in the method for preparing compounds of Formula II, the preferred anion is one that will precipitate in the reaction solution as its alkali metal salt. For practical purposes, the quaternary salt selected should preferably be nontoxic, as disclosed in the material safety data sheets supplied by its vendor.

In the adduct of Formula I, the sulfonated polyester resin is typically present in an amount of from about 78 to about 95% by weight, preferably from about 86 to about 93% by weight; the diazonium resin is typically present in an amount of from about 4 to about 11% by weight, preferably from about 5 to about 8% by weight; the quaternary cations are typically present in an amount of from about 0.3 to about 10% by weight, preferably from about 1.5 to about 6.0% by weight; and the acid anions are present in an amount of from about 0.2 to about 4% by weight, preferably from about 0.5 to about 1.5% by weight. In the adduct of Formula II, the sulfonated polyester resin is typically present in an amount of from about 80 to about 96% by weight, preferably from about 88 to about 94% by weight; the diazonium resin is typically present in an amount of from about 2.5 to about 10% by weight, preferably from about 3.5 to about 7.5% by weight; and the quaternary cations are typically present in an amount of from about 0.4 to about 12% by weight, preferably from about 0.6 to about 6.0% by weight. In the adduct of Formula III, the sulfonated polyester resin is typically present in an amount of from about 85 to about 97% by weight, preferably from about 91 to about 95% by weight; the diazonium resin is typically present in an amount of from about 3.5 to about 10% by weight, preferably from about 3.5 to about 7.5% by weight; the quaternary cations are typically present in an amount of from about 0.04 to about 6% by weight, preferably from about 0.3 to about 3.1% by weight; and the alkali metal cations are typically present in an amount of from about 0.03 to about 0.5% by weight, preferably from about 0.03 to about 0.20% by weight.

The compounds of this invention are particularly useful in the preparation of presensitized lithographic printing plates. A major advantage is that a wider range or selection of compounds is available to achieve optimum properties and performance. For example, the well known diazonium resins, which are easily prepared by condensing a 4-diazodiphenylamine with an active carbonyl compound, can be used to provide the diazonium component of the adduct. These materials are highly sensitive to radiation, and they provide good crosslinking on exposure to actinic radiation.

Because the sulfonated polyester takes up at least about 75% by weight of the compounds of this invention, the selection of the sulfonated polyester greatly influences the ultimate physical and chemical properties of the compounds of the invention and the compositions in which they are used, such as, for example, solubility in selected solvents, abrasion resistance, oleophilicity, and compatibility with other additives of the compositions. The resistance to press solvents can be greatly improved by the selection of the sulfonated polyester in presensitized printing plates. Simple 1:1 diazonium resin/sulfonated polyester adducts, such as those described in U.S. Pat. No. 4,543,315 and EP 0,462,704 can utilize only a limited number of sulfonated polyesters to ensure solubility in an environmentally acceptable solvent, such as methyl ethyl ketone. For example, for the diazonium resin/sulfonated polyester adducts to be soluble in methyl ethyl ketone, the sulfonated polyester reactant must also be soluble in methyl ethyl ketone, thereby limiting the range of possible compounds that can be used to optimize the ultimate properties. For this reason, other properties, such as resistance to press solvents and abrasion resistance, may be lowered. The compounds of this invention are not restricted in this manner because a wide range of sulfonated polyester structures, including those that are not soluble in methyl ethyl ketone, can be used in the preparation of the compounds of this invention.

The particular quaternary ammonium or phosphonium cation used in the compounds of Formula I, Formula II, or Formula III is a key factor in achieving a wide range of possible compounds. It can be incorporated by simple methods and reactions that proceed in nearly quantitative yield. It is not necessary to isolate the compounds of the invention from the reaction solvent; accordingly, these solutions can be used directly in the preparation of a radiation sensitive coating compositions.

It was also discovered that the quaternary cation imparts solubility to the compounds of this invention, and enhances performance in radiation-sensitive compositions for presensitized printing plates. For example, the exposure time remains constant over long periods of storage of the plates. It is possible to remove the unimaged areas at development temperatures of from 70° F. to 90° F. In machine processors, a greater number of plates can be processed before the developer solution is no longer effective. Plates developed in nearly exhausted developer solution will still provide good press performance. Sludge, which forms in the machine processor from the removed coating, is present in greatly reduced amounts, thereby simplifying maintenance. Ink toning during the printing process is not a problem.

Presensitized lithographic plates can be prepared by coating a solution of the radiation-sensitive compositions in a suitable solvent, e.g., methyl ethyl ketone, onto a suitable substrate and removing the solvent to provide a dry coating weight of from about 0.020 to about 0.200 grams per square foot ($g/ft^2$), and preferably from 0.050 to 0.120 $g/ft^2$.

Low boiling organic solvents, or mixtures of solvents, having a boiling point at atmospheric pressure between about 40° C. and about 150° C. can be used in the present invention as the solvent for the light sensitive adduct. Non-limiting examples of solvents include methyl ethyl ketone, 1-methoxy-2-propanol, ethylene dichloride, tetrahydrofuran, methyl isobutyl ketone, ethyl acetate, methanol, etc.

The versatility and wide variety of light-sensitive coating compositions made possible by this invention allow one to select or arrive at preferred combinations of substrate, substrate treatments, priming layers, and coating additives to achieve optimum performance.

Selected polymers having carboxylic acid groups were found to be particularly useful additives for increasing the solvent resistance of the radiation-sensitive coatings of printing plates that employed the compounds of this invention. These polymers included polyurethanes having an equivalent weight of from about 200 to about 2000, cellulose acetate hydrogen phthalate having phthalyl content of from about 20 to 35%, cellulose acetate trimellitate having a trimellityl content of about 30%, and polyvinyl hydrogen phthalate. The amount of these materials added to the radiation-sensitive composition is generally less than about 10% by weight, and most preferably from about 2 to about 6% by weight, based on the weight of the composition. To aid dissolution in methyl ethyl ketone, the cellulose acetate trimellitate is predissolved using 5 parts of a quaternary ammonium salt, e.g., tetrabutyl ammonium bromide, with 95 parts of the cellulose acetate trimellitate. The polyurethanes are prepared by reacting 2,2'-bis(hydroxymethyl)propionic acid with diisocyanates such as tolylene-2,4-diisocyanate, 1,4diphenylene diisocyanate, isophorone diisocyanate, and 1,1'-methylenebis(4-isocyanatobenzene) along with other diols such as ethylene glycol and neopentyl glycol. The preferred polymers having carboxylic acid groups have an equivalent weight of from about 200 to about 800.

The radiation-sensitive solution containing the adduct of this invention can contain other modifying additives such as a thermoplastic polymer to modify or improve the physical properties of the coating. For example, properties such as developer solubility, abrasion resistance, ink receptivity, press life, etc., can be influenced by the addition of thermoplastic polymer in amounts up to about 15 percent by weight. Suitable polymers include polyvinyl acetals, polyvinyl acetates, polyurethanes, polyesters, polyamides, polyvinylidene chloride, polyacrylates, polymethacrylates, cellulose acetate butyrate, and others. The additive should be carefully selected to be compatible with the other components of the radiation-sensitive composition. The amounts and type of resin added to improve the formulation depends upon the specific property being altered and can be arrived at empirically.

Presensitized articles are typically formulated with pigments or dyes to facilitate manufacturing control and visual appearance of the product, as well as to aid in using the article relative to positioning, developing, etc. Pre-dispersed pigments such as "Microlith" Series (tradenames for pigments predispersed in a vinyl resin, commercially available from Ciba Geigy) are useful at from about 5 to 20 weight percent of the coating. Pigments such as "Monastral Blue" and "Microlith Purple" (commercially available from Ciba Geigy) can also be used in the same general concentration range using standard milling dispersion techniques. Dyes such as triphenyl methane dyes, e.g., "Victoria Blue BO", commercially available from E. I. du Pont are also useful as coloring agents, preferably at from about 5 to 10 percent by weight of the coating.

Dyes that provide a visible image upon exposure to actinic radiation may also be incorporated in the formulation to aid a user in visualizing the exposed article prior to development. Conventional well-known leuco dye and acid-base dye printout systems can be utilized. An exemplary material is 4-(phenylazo)-diphenylamine, which can be used at from about 0.25 to 2 percent by weight of the coating.

Organic solvent-soluble diazonium salts can also be incorporated into a solution of the light-sensitive polymeric adduct to provide printing plates that provide printed copies having improved acuity. Up to about 20 percent by weight of the organic solvent-soluble diazonium salt, based on the weight of adduct, can be effectively used. Examples of such soluble salts are the organic sulfonate salts of diazonium salts such as 4-toluene diazonium toluenesulfonate and the condensation product of formaldehyde and 4-phenylaminobenzenediazonium triisopropylnaphthalenesulfonate.

Substrates onto which the radiation-sensitive solutions can be coated to provide a presensitized light sensitive article include sheet materials such as paper, plastic, or metal and preferably, those that are permanently hydrophilic and conventionally used in the preparation of lithographic plates. Aluminum, which has first been cleaned and treated to render it permanently hydrophilic, is the preferred substrate of lithographic constructions. Well-known methods of treatment include silicating, electrolytic anodizing mechanical graining, or combinations thereof. In addition to providing a durable hydrophilic background, the treatment can also influence coating performance characteristics, such as exposure time, ease of development, image adhesion, press life, etc.

If desired, the substrate can be primed by a thin layer of a subbing compound such as an aqueous solvent-soluble polymeric diazonium compound, e.g., the chloride or zinc chloride double salt of aldehyde condensation products of p-azodiphenylamine, as described in U.S. Pat. No. 2,714,066.

Developers useful for developing the exposed composition include aqueous solutions of water soluble organic solvents and, optionally, buffers, desensitizers, surfactants, stabilizers and gums. Representative examples of water soluble organic solvents for use in developers include ethanol, 1-propanol, 2-propanol, benzyl alcohol and 2-methoxyethanol, and 2-phenoxypropanol can be used at a concentration of from about 2 to about 40 percent by weight depending on the alcohol selected and its solvent power. For example, the concentration of 1-propanol or 2-propanol at 20 to 40 percent by weight is preferred, whereas that preferred for benzyl alcohol is from about 2 to about 5 percent by weight.

Surfactants and desensitizing salts are well-known additives to developer systems. Representative examples of anionic surfactants include sodium dodecylbenzenesufonate, dimethylsodiumsulfoisophthalate, sodium lauryl sulfate, dioctyl sodium sulfosuccinate, and sodium alkyl naphthalene sulfonate. Representative examples of desensitizing salts include ammonium sulfite, sodium sulfite, etc. The surfactant or desensitizing salt can be used in a concentration of from about 0.5 to 10 percent by weight, and preferably, from about 0.5 to 2.0 percent by weight, of the developer solution. For a further discussion of developers, see U.S. Pat. No. 5,279,927.

The invention will now be more specifically described by the use of the following non-limiting examples, wherein all parts are by weight unless otherwise indicated.

Preparations, Comparative Example, and Examples

The following preparatory examples illustrate methods for synthesizing sulfonated polyesters, 1:1 diazonium resin/ sulfonated polyester adducts, and quaternary salts of sulfonated polyesters that are useful in the preparation of the compounds of this invention. The diazonium resin used in the synthesis of the intermediates and compounds of this invention is the well-known formaldehyde condensation product of 4-diazodiphenylamine, as described in U.S. Pat. No. 2,714,066, incorporated herein by reference. This material has an average gram equivalent weight of about 320 g per diazonium group and consists of a mixture of oligomers wherein about 70–75% have fewer than eight units and 25–30% have more than eight units.

and a 7.6 L pressure vessel was substituted for the 37.8 L vessel, whenever the batch sizes were smaller. The mole percentage of ethylene glycol and neopentyl glycol was not changed. Table 1 identifies the composition of each sodiosulfopolyester in Preparations 2–9 by the mole percentage of diacid used, sulfonate equivalent weight, molecular weight, and $T_g$. The amount of glycol esters in all of the preparations was about 49 mole percent ethylene esters, 0.5 mole percent diethylene glycol esters, and 50.5 mole percent neopentyl glycol esters.

TABLE 1

| Preparation | Diacid monomer and amount (mole percent) | | | | Theoretical eq. wt. | Mol. wt. | $T_g$ (°C.) |
|---|---|---|---|---|---|---|---|
| | $A^1$ | $B^2$ | $C^3$ | $D^4$ | | | |
| 2 | 10.0 | 45.0 | 15.0 | 30 | 2400 | 38977 | 44.6 |
| 3 | 13.1 | 52.0 | 0.1 | 30 | 1828 | — | 64.4 |
| 4 | 10.0 | 55.0 | 5.0 | 30 | 2364 | — | 70.9 |
| 5 | 9.5 | 65.5 | 15.0 | 10 | 2403 | 32426 | 38.7 |
| 6 | 9.7 | 55.3 | 15.0 | 20 | 2413 | 33510 | 40.5 |
| 7 | 9.8 | 60.1 | 0.1 | 30 | 2400 | 33463 | 74.0 |
| 8 | 10.0 | 55.0 | 5.0 | 30 | 2400 | 33510 | 59.2 |
| 9 | 13.0 | 56.9 | 0.1 | 30 | 1828 | — | 74.7 |

[1] A represents 5-sodiosulfoisophthalic acid.
[2] B represents isophthalic acid for Preparations 2, 3, and 5–9, and terephthalic acid for Preparation 4.
[3] C represents sebacic acid.
[4] D represents 5-t-butylisophthalic acid.

Preparation 1

This preparation illustrates the synthesis of a sulfonated polyester having sodium cations. Sulfonated polyesters are alternatively referred to herein as "sulfopolyesters."

Into a 37.8 L pressure vessel equipped with a high torque stirrer, reflux column, and means for maintaining an atmosphere of nitrogen over the contents of the vessel, were added 5-sodiosulfoisophthalic acid (1.866 kg, 6.93 moles), isophthalic acid (9.516 kg, 57.22 moles), sebacic acid (2.29 kg, 11.33 moles), ethylene glycol (7,972 kg, 128.58 moles), neopentyl glycol (7,868 kg, 75.6 moles), antimony trioxide (6.8 g), and triethylamine (55.9 g). The vessel was then sealed and pressurized to 40 psi with nitrogen. While being stirred, the mixture was heated to a temperature of 250° C. over a period of approximately 90 minutes, over which time evolution of water was observed. The pressure was then gradually reduced to 1.0 torr and the mixture underwent polymerization for approximately two hours. The temperature of the reaction mixture gradually increased up to about 280° C. After this time, the polymer was discharged from the vessel as an extremely viscous, clear liquid. The theoretical equivalent weight of this polymer was 2417 g polymer per mole of sulfonate. This high molecular weight sodiosulfopolyester contained 9.2 mole percent 5-sulfoisophthalate, 75.8 mole percent isophthalate, 15 mole percent sebacate, 51.8 mole percent ethylene esters, 0.2 mole percent diethylene glycol esters, and 46.0 mole percent neopenyl esters. This polymer had a $T_g$ of 34.8° C., and was soluble in organic solvents, such as tetrahydrofuran and n-propanol/water, but was insoluble in methyl ethyl ketone.

Preparation 2–9

Additional sodiosulfopolyesters were prepared by means of the procedure of Preparation 1, with the exceptions that the mole percentages of the diacid monomers were varied Preparation 10

This preparation illustrates the synthesis of a 1:1 diazonium resin/sulfonated polyester adduct, as described in U.S. Pat. Nos. 4,401,473; 4,543,315; and EP 0 462 704.

Solution A was prepared in a one gallon glass container by slurrying the sodiosulfopolyester of Preparation 1 (240 g, eq. wt. 2417, 0.099 eq) in deionized water (1600 g) and heating the mixture to a temperature of 60° C. for a period of 30 minutes to swell the resin. The resin appeared to be white in color. To this slurry was added 1-propanol (400 g), the container sealed, and the mixture shaken overnight at room temperature, after which time the sodiosulfopolyester had completely dissolved. The container was fitted with a high speed stirrer and a dropping funnel.

Solution B was prepared by dissolving the zinc chloride double salt of the formaldehyde condensation product of 4-diazodiphenylamine (36.4 g, eq. wt. 322, 0.113 eq) in 900 g of deionized water, with stirring at room temperature, and added to the dropping funnel. The composition of the diazonium resin was analyzed by High Performance Liquid Chromatography and found to consist of the following oligomers in the amounts indicated: monomer =0.2% by weight; dimer =3.2% by weight; trimer =6.8% by weight; tetramer =13.1% by weight; pentamer =16.4% by weight; hexamer =15.0% by weight; heptamer =12.3% by weight; octyl =9.6% by weight; higher =23.1% by weight.

Solution B was added to Solution A with rapid stirring over a period of approximately 20–30 minutes. The 1:1 diazonium resin/sulfonated polyester adduct precipitated during this period. Near the end of the addition of solution B, the reaction mixture typically thickened and then redispersed. Stirring was continued for an additional 30 minutes and then stopped. After standing undisturbed for approximately four hours, the precipitate settled to the bottom of the container, and the solvent was removed by decanting. The precipitate was then slurried in 2 L of deionized water, stirred for approximately one hour, collected by filtration, dried at a temperature of approximately 35° C. for 48 hours to yield 258 g of a golden yellow solid, which was the 1:1 diazonium resin/sulfonated adduct. The 1:1 adduct contained about 7.2% by weight diazonium resin cations and 92.8% by weight sulfonated polyester anions.

Preparations 11–18

Preparations 11–18 illustrate 1:1 diazonium resin/sulfonated polyester adducts prepared by means of the procedure of Preparation 10, with the exceptions that the amount of diazonium resin was adjusted according to its particular equivalent weight and the equivalent weight of the sulfonated polyester. As in Preparation 1, a slight excess (1.14 equivalents) of diazonium resin was used in the reaction. The other exceptions were that the ratio of water to n-propanol was varied to produce a particulate precipitate and avoid the formation of an intractable material. Table 2 identifies the components and amounts thereof in the 1:1 diazonium resin/sulfonated polyester adducts of Preparations 11–18.

A series of fully quaternized sulfonated polyester salts were prepared by adding the quantity of the tetraalkylammonium salt listed in Table 3 to a solution containing the sodiosulfopolyester of Preparation 7 (1,000 g, 0.042 meq) in 10.0 g of methyl ethyl ketone containing 0.5% by weight deionized water. The sodium salt of the quaternary anion precipitated out of the solution after standing overnight, except in Preparations 22, 28, and 29 where no precipitate was formed. The quaternary salts of the sulfonated polyester were formed in quantitative yield and had the compositions as set forth in Table 3. These solutions were used to prepare the compounds having general Formula II in Examples XV to XXV.

TABLE 2

| | | Diazonium resin | | | | Composition by weight (%) | | |
|---|---|---|---|---|---|---|---|---|
| Preparation | Sulfopolyester of Preparation No. | Amount (g) | Amount (g) | Eq. wt. | Ratio of water to 1-propanol | Yield (g) | diazonium cation | sulfopolyester anion | Eq. wt. |
| 11 | 2 | 240 | 35.9 | 307 | 1350/550 | 245 | 6.7 | 93.3 | 2545 |
| 12 | 3 | 240 | 45.5 | 304 | 1350/550 | 250 | 8.5 | 91.5 | 1973 |
| 13 | 4 | 240 | 36.5 | 315 | 1350/550 | 252 | 7.1 | 92.9 | 2520 |
| 14 | 5 | 240 | 35.9 | 315 | 1680/300 | 245 | 7.0 | 93 | 2559 |
| 15 | 6 | 240 | 35.6 | 315 | 1600/282 | 255 | 7.0 | 93 | 2569 |
| 16 | 7 | 240 | 35.0 | 307 | 1350/550 | 260 | 6.7 | 93.3 | 2548 |
| 17 | 8 | 240 | 45.6 | 304 | 1350/550 | 260 | 8.5 | 91.5 | 2548 |
| 18 | 9 | 240 | 35.0 | 307 | 1200/550 | 255 | 6.7 | 93.3 | 1973 |

Preparations 19–29

These preparations illustrate the reaction of a sodiosulfopolyester with tetrabutylammonium bromide to form the full quaternary salt.

TABLE 3

| | | | Composition by weight (%) | | |
|---|---|---|---|---|---|
| Prep. | Quaternary salt | Amount (g) | Quaternary cation | Sulfopolyester | Eq. wt. |
| 19 | tetraethyl ammonium p-toluene sulfonate | 0.126 | 5.2 | 94.8 | 2548 |
| 20 | tetrapropylammonium bromide | 0.111 | 7.3 | 92.7 | 2619 |
| 21 | tetrabutylammonium bromide | 0.134 | 9.2 | 90.8 | 2619 |
| 22 | tetrabutylammonium chloride-hydrate | 0.116 | 9.2 | 90.8 | 2619 |
| 23 | tetrabutylammonium p-toluene sulfonate | 0.172 | 9.2 | 90.8 | 2619 |
| 24 | tetrahexylammonium bromide | 0.181 | 13.0 | 87.0 | 2731 |
| 25 | tetraoctylammonium bromide | 0.228 | 16.4 | 83.6 | 2844 |
| 26 | benzyltriethylammonium chloride | 0.095 | 7.7 | 92.5 | 2570 |
| 27 | myristyltrimethylammonium bromide | 0.140 | 9.7 | 90.3 | 2633 |
| 28 | benzyldimethylstearyl- | 0.184 | 13.9 | 86.1 | 2761 |

TABLE 3-continued

| | | Composition by weight (%) | | | |
|---|---|---|---|---|---|
| Prep. | Quaternary salt | Amount (g) | Quaternary cation | Sulfopolyester | Eq. wt. |
| 29 | ammonium chloride-hydrate benzyltributylammonium chloride | 0.130 | 10.4 | 89.6 | 2654 |

Comparative Example A

This comparative example describes the preparation of a radiation-sensitive coating and lithographic printing plate containing a 1:1 adduct of a diazonium resin/sulfopolyester adduct according to the disclosure of EP 0,462,704.

A solution containing the 1:1 diazonium resin/sulfonated polyester adduct of Preparation 11 was used to prepare a lithographic printing plate according to the general procedure of Example 6 of EP 0,462,704. The dried coating composition consisted of the following ingredients in the amounts indicated: 67.9% by weight of the 1:1 diazonium resin/sulfopolyester adduct of Preparation 11; 17.0% by weight of the sodiosulfopolyester of Preparation 2; 6.0% by weight of cellulose acetate butyrate in methyl ethyl ketone ("C-A-B" 500-5, Eastman Chemical Company); 0.6% by weight of 4-(phenylazo)diphenylamine; and 8.5% by weight of a mill base containing a mixture of 5 parts by weight Sunfast Blue 249-1284 pigment (Sun Chemical Corp.) and 1 part by weight vinyl chloride/vinyl acetate copolymer ("VYNS-3" resin, Union Carbide Corp.).

Example I

This example describes the preparation of a compound of Formula I, i.e., the adduct of a sulfonated polyester, a diazonium resin, and a quaternary ammonium salt, by reacting tetrabutylammonium bromide with a 1:1 diazonium resin/sulfonated polyester adduct in methyl ethyl ketone.

A solution was prepared by adding tetrabutylammonium bromide (4.20 g, 0.013 eq) to methyl ethyl ketone (2177 g) containing deionized water (12.50 g) and stirring until dissolution was complete. To this solution was added the 1:1 diazonium resin/sulfonated polyester adduct of Preparation 10 (120.9 g, theoretical eq. wt. 2580, 0.047 eq), and the mixture was agitated on a shaker for approximately 2–3 hours to produce a clear solution free of solid particles. During this time, the 1:1 adduct, which was insoluble in the reaction solvent, reacted with the tetrabutylammonium bromide. The compound contained approximately 6.96% by weight diazonium resin cations, 2.52% by weight tetrabutylammonium cations, 89.68% by weight sulfonated polyester, and 0.83% by weight bromide anions. This adduct was formed in essentially quantitative yield, and, unlike the 1:1 diazonium resin/sulfonated polyester adduct used to prepare it, was completely soluble in the reaction solvent. The reaction solution containing the compound of the invention was used directly in the preparation of the radiation-sensitive composition, as described in Example II.

Example II

This example describes the preparation of a radiation-sensitive composition and a lithographic printing plate using the compound of the invention having Formula I. The compound was prepared in Example I.

A radiation-sensitive coating solution (total of 2500 g, 6.00% by weight solids) was prepared by adding to the solution of Example I (which contained 125.1 g of the sulfonated polyester/diazonium resin/tetrabutylammonium bromide adduct) the following solutions: 67.5 g of a 10% solution of cellulose acetate butyrate in methyl ethyl ketone ("C-A-B" 500-5, Eastman Chemical Company); 9.00 g of a 10% solution of 4-(phenylazo)diphenylamine in methyl ethyl ketone; 45.00 g of a 10% solution of oxalic acid in methyl ethyl ketone; and 63.75 g of a 20% mill base solution containing 10.62 g of Sunfast Blue 249-1284 pigment (Sun Chemical Corp.) and 2.12 g of a vinyl chloride/vinyl acetate copolymer ("VYNS-3" resin, Union Carbide Corp.) in methyl ethyl ketone. Stirring was used to aid dissolution.

An aluminum web (8 mil), which had previously been electrochemically grained, anodized (anodic coating weight 0,200 g/ft$^2$), and silicated, was primed on a machine coater with a diazonium resin comprising the formaldehyde condensation product of 4-diazodiphenylamine to produce a coating weight of about 0,001 to 0.003 g/ft$^2$ after drying. The radiation-sensitive coating solution was then machine coated on top of the priming layer to give a coating weight of approximately 0.100 g/ft$^2$. The radiation-sensitive coating consisted of the following ingredients in the amounts indicated: 83.4% by weight of the compound of the invention from Example I; 4.5% by weight cellulose acetate butyrate; 0.6% by weight 4-(phenylazo)diphenylamine; 3.0% by weight oxalic acid; and 8.5% by weight mill base. The lithographic plate was imaged by exposing the composition for 24 seconds through a 41-step photographic step wedge using a Berkey vacuum exposure frame fitted with a 5 Kw diazo bulb. An image was clearly visible on the exposed plate. The aluminum plate was then passed through an automatic processor (3M Brand Model 1133 "VIKING" plate processor) containing a developer (3M Brand "VIKING" negative developer) and a gum ("VIKING" gum with gum arabic) at a temperature of 82° F. The unexposed areas were cleanly removed and exhibited a reflected density (cyan filter) of 0.01, thereby clearly illustrating the absence of any staining of the background areas. Seven steps were reproduced in the photographic step-wedge. The plates were shown to be processable over a wide temperature range. Plates processed in a 3M Model 1124 "VIKING" plate processor using "VIKING" 2-in-1 developer gum at a temperature of 70° F. had a reflected density of 0.01 to 0.02 in the nonimage areas, thereby clearly showing that staining was not a problem. Even after the plates were aged at a temperature of 140° F. for three days and processed in the 1133 "VIKING" processor at a temperature of 82° F. using "VIKING" developer which had been exhausted by processing 2500 square feet of plates, the reflected density in the background areas remained at 0.02. When tested on a lithographic press, the plates exhibited excellent resistance to blanket toning, produced high quality halftone prints, and had good press life. Products having the trademark "VIKING" are commercially available from Minnesota Mining and Manufacturing Company.

Example III

This example describes the preparation and isolation of the adduct of a sulfonated polyester, a diazonium resin, and a quaternary ammonium salt having the general Formula I by reacting tetrabutylammonium bromide with a 1:1 diazonium resin/sulfonated polyester resin in methyl ethyl ketone.

To a solution containing tetrabutylammonium bromide (0.176 g) in methyl ethyl ketone (55 g) was added the 1:1 diazonium resin/sulfonated polyester adduct of Preparation 10 (5.00 g). The mixture was agitated on a shaker for approximately 2–3 hours to form a compound containing approximately 2.55% by weight tetrabutylammonium cations. This compound was isolated by methods A–C and analyzed by NMR (nuclear magnetic resonance) spectroscopy to confirm that the tetrabutylammonium cation was bound within the polyelectrolyte adduct.

Method A: Approximately 20 g of the solution was concentrated on a rotary evaporator to dryness and a portion of the resin material (approximately 0.200 g) was redissolved in DMSO-$d_6$ (1.0 g). DMSO-$d_6$ is deuterated methyl sulfoxide. Analysis by NMR showed the compound to contain 2.67% by weight tetrabutylammoniun ions.

Method B: The compound was precipitated by adding approximately 10 g of the solution to diethyl ether with rapid stirring. The soft resin was collected, dried, and the resin material (approximately 0.200 g) redissolved in DMSO-$d_6$ (1.0 g). Analysis by NMR showed the compound to contain 2.60% by weight tetrabutylammonium ions. Tetrabutylammonium bromide is soluble in diethyl ether and would have been expected to be extracted if not bound into the adduct.

Method C: The compound was precipitated with hexane using the procedure of Method B and found to contain 2.59% by weight of the tetrabutylammonium ion.

A 2 square foot sample of the lithographic plate (unexposed) prepared in Example II was washed with diethyl ether (200-300 mL) in a tray. The diethyl ether was removed on a rotary evaporator to give a very small amount of a slightly yellow residue. NMR analysis showed that tetrabutylammonium ions were not present and the residue was identified as one of the plate additives, 4-(phenylazo)diphenylamine.

This experiment clearly showed that the tetrabutylammonium cations and the bromide anions are associated with the diazonium resin cations and sulfonated polyester to form the compound having Formula I.

Examples IV–XI

These examples describe the preparation of a series of compounds having the general Formula I by reacting either tetrabutylammonium bromide or tetrabutylammonium p-toluenesulfonate with a 1:1 diazonium resin/sulfonated polyester resin in methyl ethyl ketone.

A series of compounds was prepared by reacting the 1:1 diazonium resin/sulfonated polyester adducts and the quaternary salts listed in Table 4 in the amounts indicated. In Examples IV–VIII, 132.3 g of methyl ethyl ketone containing 0.5% by weight deionized water was used as the reaction solvent. In Examples IX–XI, 140.5 g of this reaction solvent was used. The composition of the compounds of this example are also listed in Table 4. The compounds formed were present at a concentration of 10% by weight. These solutions were used to prepare the radiation-sensitive compositions of Example XII.

TABLE 4

| Ex. | 1:1 adduct of Preparation No. | Amount (g) | Amount of Bu$_4$NBr (g) | Amount of Bu$_4$NOTs (g) | Yield (g) | Composition by weight (%) of adduct (Formula I) | | | | |
|---|---|---|---|---|---|---|---|---|---|---|
| | | | | | | diazonium cation | Bu$_4$N cation | sulfopolyester anion | Br anion | OTs anion |
| IV | 12 | 14.18 | 0.52 | — | 14.70 | 8.21 | 2.66 | 88.25 | 0.88 | — |
| V | 13 | 14.18 | 0.52 | — | 14.70 | 6.87 | 2.50 | 89.81 | 0.83 | — |
| VI | 14 | 14.18 | 0.52 | — | 14.70 | 6.75 | 2.62 | 89.76 | 0.87 | — |
| VII | 15 | 14.18 | 0.52 | — | 14.70 | 6.72 | 2.66 | 89.74 | 0.88 | — |
| VIII | 12 | 14.18 | — | 0.52 | 14.70 | 8.21 | 2.07 | 88.25 | — | 1.47 |
| IX | 13 | 15.09 | — | 0.55 | 15.64 | 6.48 | 2.18 | 89.43 | — | 1.55 |
| X | 14 | 15.09 | — | 0.55 | 15.64 | 6.73 | 2.18 | 889.53 | — | 1.55 |
| XI | 15 | 15.09 | — | 0.55 | 15.64 | 6.71 | 2.18 | 89.56 | — | 1.55 |

Example XII

This example describes the preparation of a series of radiation-sensitive compositions and lithographic printing plates using the compounds of the invention having Formula I. The compounds were prepared in Examples IV–XI.

A series of radiation-sensitive coating solutions was prepared by adding the following ingredients in the amounts indicated to 14.70 g of each of the solutions of Examples IV–VIII: 6.03 g of methyl ethyl ketone; 0.125 g of deionized water; 0.938 g of a 10% solution of polyvinyl hydrogen phthalate in methyl ethyl ketone; 0.844 g of a 10% solution of cellulose acetate butyrate in methyl ethyl ketone ("C-A-B" 500-5, Eastman Chemical Company); 1.125 g of a 1.0% solution of 4(phenylazo)diphenylamine in methyl ethyl ketone; 0.563 of a 10% solution of oxalic acid in methyl ethyl ketone; and 0.797 g of a 20% mill base solution containing a mixture of 5 parts by weight Sunfast Blue 249–1284 pigment (Sun Chemical Corp.) and 1 part by weight vinyl chloride/vinyl acetate copolymer ("VYNS-3" resin, Union Carbide Corp.) in methyl ethyl ketone. Each solution in the series weighed 25 g and contained 7.50% by weight solids. Each solution contained 1.470 g of the sulfonated polyester/diazonium resin/tetrabutylammonium bromide adduct. Stirring was used to aid dissolution. Lithographic printing plates were prepared by coating these compositions by means of a wire wound rod onto the anodized, silicated, and diazo primed aluminum described in Example II. The dried coating weight was approximately 0.100 g/ft$^2$. The radiation-sensitive coating consisted of the following ingredients in the amounts indicated: 78.4% by weight of the compound of the invention; 5.0% by weight polyvinyl hydrogen phthalate; 4.5% by weight cellulose acetate butyrate; 0.6% by weight 4-(phenylazo) diphenylamine; 3.0% by weight oxalic acid; and 8.5% by weight mill base.

Lithographic plates were also prepared as described in the previous paragraph, with the exceptions that the polyvinyl hydrogen phthalate was omitted and the amount of the solution used from Examples IX–XI was increased to 15.64 g. The solutions from Examples IX–XI contained 1.564 g of the sulfonated polyester/diazonium resin/tetrabutylammonium bromide adduct. The radiation-sensitive coating consisted of the following ingredients in the amounts indicated: 83.4% by weight of the compound of the invention; 4.5% by weight cellulose acetate butyrate; 0.6% by weight 4-(phenylazo)diphenylamine; 3.0% by weight oxalic acid; and 8.5% by weight mill base.

The plates were exposed, processed, and evaluated for background stain measured using the procedure described in Example II. The background stain values ranged from 0.01 to 0.03 on plates processed at temperatures of 70° F. and 82° F. Seven to eleven steps were reproduced on the 41-step photographic step-wedge. The resistance to press solvent varied and was shown to be mainly influenced by the structure of the sulfonated polyester. Adducts containing sulfonated polyesters with lower amounts of the sebacic acid or the 5-t-butylisophthalic acid monomers gave better solvent resistance. The presence of the polyvinyl hydrogen phthalate generally improved solvent resistance.

Example XIII

This example describes the improvement of solvent resistance of the compositions of the invention by the addition of a polymer having carboxylic acid groups, cellulose acetate trimellitate.

A radiation-sensitive composition (2579 g, 6.12% by weight solids) was prepared by adding 78.92 g of a solution containing 7.50 g of cellulose acetate trimellitate ("C-A-T", Eastman Chemical Company) and 0.39 g of tetrabutylammonium bromide to the coating solution prepared in Example II.

This composition was used to coat a lithographic printing plate using the same procedure as described in Example II. The dried radiation-sensitive coating consisted of the following ingredients in the amounts indicated: 79.5% by weight of the compound of Example I; 4.3% by weight cellulose acetate butyrate; 0.6% by weight 4-(phenylazo)diphenylamine; 2.9% by weight oxalic acid; 4.8% by weight cellulose acetate trimellitate; and 8.5% by weight mill base. The exposed and processed lithographic plates exhibited the same reflected density values in the background areas of the image. When tested on a lithographic press, the plates exhibited excellent resistance to blanket toning, produced high quality halftone prints, and had good press life.

A comparison of the solvent resistance of the plates prepared in Comparative Example A, Example II, and this example was performed using commercially available solvents routinely used to clean blankets, plates, and press rollers during the printing operation. The plates had been exposed and machine processed in the manner described in Example II. The protective coating of gum was removed by washing with water. The comparison test involved affixing 4 in.×24 in. plates to a flat surface so that they were positioned next to each other. A 2 in.×3 in. weighted pad fitted with a paper wipe was wet with solvent, and then passed across the plates in the number of passes indicated in Table 5. The pressure applied was approximately 3 lbs./in$^2$. The degree of solvent resistance was measured by the following formula:

$$A=B/C\times 100$$

where A represents a measure of the coating removed by the solvent in comparison with the original coating; B represents the reflected density of the abraded areas; and C represents the reflected density of the unabraded areas. A value of 100 is the best solvent resistance. The results of this test are listed in Table 5. These results clearly show that compositions containing the compounds of the invention had significantly better resistance than the comparative example and that the addition of the cellulose acetate trimellitate resulted in an improvement.

TABLE 5

| Example | Solvent | | | | |
| --- | --- | --- | --- | --- | --- |
| | A[1] | B[2] | C[3] | D[4] | E[5] |
| Comparative A | 72 | 68 | 60 | 59 | 58 |
| I | 96 | 98 | 90 | 87 | 85 |
| XIII | 98 | 100 | 98 | 96 | 92 |

[1]Solvent A is V-120, Varn Products Company, Inc.; 20 passes.
[2]Sovlent B is RVA 119 Blanket and Roller Wash, Rogersol. Inc.; 10 passes.
[3]Solvent C is Varn Color Wash Step 2, Varn Products Company, Inc.; 5 passes.
[4]Solvent D is Roller and Blanket Wash, Bingham; 10 passes.
[5]Solvent E is "PRISCO" DX, Printers' Service; 5 passes.

Example XIV

This example describes the preparation of a compound of Formula I, i.e., the adduct of a sulfonated polyester, a diazonium resin, and a quaternary phosphonium cation by reacting tetrabutylphosphonium bromide with a 1:1 diazonium resin/sulfonated polyester adduct.

Tetrabutylphosphonium bromide (0.11 g) was reacted with the 1:1 diazonium resin/sulfonated polyester adduct of Preparation 10 (3.02 g) in methyl ethyl ketone (42 g) using the general procedure of Example I. The compound of Formula I was formed in quantitative yield and contained approximately 6.97% by weight diazonium resin cations, 2.56% by weight tetraphosphonium cations, 89.68% by weight sulfonated polyester anions, and 0.79% by weight bromide anions. The foregoing solution was converted into a coating composition by adding the following solutions thereto: 1.69 g of a 10% solution of cellulose acetate butyrate ("CAB" 500-5, Eastman Chemical Company) in methyl ethyl ketone; 1.13 g of a 10% solution of oxalic acid in methyl ethyl ketone; 0.23 g of a 10% solution of 4-(phenylazo)diphenylamine in methyl ethyl ketone; 1.59 g of a 20% mill base containing 0.318 g of a mixture of 5 parts by weight Sunfast Blue 249-1284 pigment (Sun Chemical Corp.) and 1 part by weight vinyl chloride/vinyl acetate copolymer ("VYNS-3" resin, Union Carbide Corp.) in methyl ethyl ketone. This solution, which contained about solutions became clear and the compounds of the invention having Formula II were formed in essentially quantative yield. The adducts of the invention contained diazonium resin cations, tetrabutylammonium cations, and sulfopolyester anions in the amounts shown in Table 6. The solutions containing these adducts were used directly to prepare radiation-sensitive coatings described in Examples XXVI–XXXVI.

TABLE 6

| Ex. | Quaternary sulfopolyester of Preparation No. | Amount (g) | Amount (meq) | 1:1 adduct (Preparation 16) (g) | 1:1 adduct (Preparation 16) (meq.) | Yield (g) | Quaternary cation | Quat. cation | Diazo cation | Sulfo-polyester |
|---|---|---|---|---|---|---|---|---|---|---|
| XV | 19 | 0.298 | 0.12 | 1.273 | 0.50 | 1.57 | tetraethyl-ammonium | 1.3 | 5.4 | 93.3 |
| XVI | 20 | 0.307 | 0.12 | 1.273 | 0.50 | 1.58 | tetrapropyl-ammonium | 1.4 | 5.4 | 93.2 |
| XVII | 21 | 0.308 | 0.12 | 1.273 | 0.50 | 1.58 | tetrabutyl ammonium | 1.8 | 5.4 | 92.8 |
| XVIII | 22 | 0.311 | 0.12 | 1.273 | 0.50 | 1.58 | tetrabutyl-ammonium | 1.8 | 5.4 | 92.8 |
| XIX | 23 | 0.298 | 0.11 | 1.273 | 0.50 | 1.57 | tetrabutyl-ammonium | 1.8 | 5.4 | 92.8 |
| XX | 24 | 0.309 | 0.11 | 1.273 | 0.50 | 1.58 | tetrahexyl-ammonium | 2.7 | 5.3 | 92.0 |
| XXI | 25 | 0.308 | 0.11 | 1.273 | 0.50 | 1.58 | tetraoctyl-ammonium | 3.5 | 5.3 | 91.2 |
| XXII | 26 | 0.312 | 0.12 | 1.273 | 0.50 | 1.59 | benzyltriethyl-ammonium | 1.5 | 5.4 | 93.1 |
| XXIII | 27 | 0.309 | 0.12 | 1.273 | 0.50 | 1.58 | myristyltrimethyl-ammonium | 1.9 | 5.4 | 92.7 |
| XXIV | 28 | 0.311 | 0.11 | 1.273 | 0.50 | 1.59 | benzyltriethyl-stearylammonium chloride-hydrate | 2.9 | 5.3 | 91.8 |
| XXV | 29 | 0.313 | 0.12 | 1.273 | 0.50 | 1.59 | benzyltributyl-ammonium | 2.1 | 5.4 | 92.3 |

3.75 g of coating solids, was coated onto an anodized and diazonium resin primed aluminum plate as described in Example II, with the exception that the coating was carried out with a wire wound rod and the exposure was through a 21-step photographic wedge. The dry coating contained the following ingredients in the approximate amounts indicated: 80.6% by weight of the compound of the invention having Formula I; 4.5% by weight cellulose acetate butyrate; 3.0% by weight oxalic acid; 0.6% by weight 4-(phenylazo)diphenylamine; 8.5% by weight mill base. Five steps were reproduced on the step-wedge. The unexposed areas were cleanly removed and exhibited a reflected density (cyan filter) of 0.02, which clearly illustrated the absence of any staining of the background areas.

Examples XV–XXV

This example describes the preparation of adducts of a sulfonated polyester, a diazonium resin, and a quaternary ammonium salt having the general Formula II by reacting each of the quaternary ammonium salts of sulfonated polyester of Preparations 19 to 29 with the 1:1 diazonium resin/sulfonated polyester resin of Preparation 16.

A portion of each of the solutions from Preparations 19 to 29, containing the amount of the quaternary sulfonated polyester salt shown in Table 6, was added to 10 g of methyl ethyl ketone to form a series of solutions. To each of these solutions was added 1.273 g of the 1:1 diazonium resin/ sulfopolyester adduct of Preparation 16. The reaction mixtures were shaken for two hours. During this time, the

Examples XXVI–XXXVI

These examples describe the preparation of radiation-sensitive compositions and lithographic printing plates using the compounds of the invention having Formula II. These compounds were prepared in Examples XV–XXV.

The solutions containing the compounds of the invention (Formula II) comprising diazonium resin cations, quaternary ammonium cations, and sulfonated polyester anions as described in Examples XV–XXV were converted into coating solutions by adding about 7.5 g of methyl ethyl ketone and the following solutions thereto: 1.125 g of a 10% solution of cellulose acetate butyrate ("CAB" 500-5, Eastman Chemical Company) in methyl ethyl ketone; 0,113 g of a 10% solution of 4-(phenylazo)diphenylamine in methyl ethyl ketone; 0.797 g of a 20% mill base containing 0.159 g of a mixture of 5 parts by weight Sunfast Blue 249-1284 pigment (Sun Chemical Corp.) and 1 part by weight vinyl chloride/vinyl acetate copolymer ("VYNS-3" resin, Union Carbide Corp.). These solutions, which contained about 1.87 g of coating solids were coated onto an anodized and diazonium resin primed aluminium plate as described in Example II, with the exception that the coating was carried out with a wire wound rod and the exposure was through a 21-step photographic wedge. The dry coating contained the following ingredients in the approximate amounts indicated: 84.9 % by weight of the compound of the invention having Formula II; 6.0% by weight cellulose acetate butyrate; 0.6% by weight 4-(phenylazo)diphenylamine; 8.5% by weight mill base. Each of the plates were imaged and processed according to the methods described in Example II and the results are set forth in Table 7.

TABLE 7

| Ex. | Adduct (Formula II) of Ex. No. | Steps[1] in fresh plates | Stain | Steps[1] in aged[2] plates | Stain |
|---|---|---|---|---|---|
| XXVI | XV | 6 | none | 6 | heavy |
| XXVII | XVI | 6 | none | 6 | moderate |
| XXVIII | XVII | 6 | none | 6 | moderate |
| XXIX | XVIII | 6 | none | 6 | moderate |
| XXX | XIX | 6 | none | 6 | moderate |
| XXXI | XX | 6 | none | 6 | slight |
| XXXII | XXI | 6 | none | 6 | slight |
| XXXIII | XXII | 6 | slight | 6 | moderate |
| XXXIV | XXIII | —[3] | —[3] | —[3] | —[3] |
| XXXV | XXIV | 6 | none | 6 | slight |
| XXXVI | XXV | 6 | none | 6 | slight |

[1]21-step photographic wedge
[2]3 days, 140° F.
[3]Coating composition precipitated when cellulose acetate butyrate was added.

Example XXXVII

This example describes the preparation of the compound of the invention having Formula II comprising the adduct of a diazonium resin cation, a tetrabutylphosphonium cation, and a sulfonated polyester anion and the preparation of a lithographic plate utilizing that compound.

A fully quaternized sulfonated polyester was prepared by adding tetrabutylphosphonium bromide (3.70 g, 0.011 eq) to a dispersion of the sodiosulfopolyester of Preparation 9 (20 g, 0.011 eq) in methyl ethyl ketone (202.1 g) containing deionized water (1.13 g). The mixture was agitated on a shaker for 10–12 hours, after which time only a fine white precipitate of sodium bromide remained. The sodium bromide was allowed to settle. The tetrabutylphosphonium salt of the sulfonated polyester (22.58 g, eq. wt. 2064) was formed in quantitative yield and comprised about 12.6% by weight tetrabutylphosphonium cations and 87.4% by weight sulfonated polyester anions.

A portion of the aforementioned solution (3.19 g), which contained the tetrabutylphosphonium sulfonated polyester salt (0,319 g, 0.15 meq) was added to 10 g of methyl ethyl ketone. Then the 1:1 diazonium resin/sulfopolyester adduct (1,329 g, 0.67 meq) of Preparation 18, which is insoluble in methyl ethyl ketone, was dispersed in the solution, and the resulting dispersion was shaken for 2–3 hours. During this time, the solution became clear, and the compound having Formula II (1,648 g) was formed in essentially quantative yield. The adduct comprised 7.0% by weight diazonium resin cations, 2.4% by weight tetrabutylphosphonium cations, and 90.6% by weight sulfonated polyester anions.

To this solution, which contained 1,648 g of the sulfonated polyester/diazonium resin/tetrabutylphosphonium adduct, was added 12.0 g of methyl ethyl ketone and the following solutions: 0,562 g of a 10% solution of cellulose acetate butyrate ("CAB" 500-5, Eastman Chemical Company) in methyl ethyl ketone; 0,113 g of a 10% solution of 4-(phenylazo)diphenylamine in methyl ethyl ketone; 0.797 g of a 20% mill base containing 0,159 g of a mixture of 5 parts by weight Sunfast Blue 249-1284 pigment (Sun Chemical Corp.) and 1 part by weight vinyl chloride/vinyl acetate copolymer ("VYNS-3" resin, Union Carbide Corp.). A lithographic plate was coated using the method described in Example XII. The dry coating contained the following ingredients in the approximate amounts indicated: 87.9% by weight of the compound of the invention having Formula II; 3.0% by weight cellulose acetate butyrate; 0.6% by weight 4-(phenylazo)diphenylamine; 8.5% by weight mill base. The plate was exposed and processed as described in Example II to give a plate having a clean background.

Example XXXVIII

This example describes the preparation of a adduct having the general Formula III consisting of a sulfonated polyester anion, a diazonium resin cation, a sodium cation, and a quaternary ammonium cation by reacting the tetrabutylammonium salt of a sodiosulfopolyester of Preparation 9 with a 1:1 diazonium resin/sulfonated polyester adduct of Preparation 18 in methyl ethyl ketone.

A sulfonated polyester in which 50% of the sulfonate groups were associated with a tetrabutylammonium cation and 50% were associated with a sodium cation was prepared by adding tetrabutylammonium bromide (1.76 g, 5.46 meq) to a dispersion of the sodiosulfopolyester of Preparation 9 (20 g, 10.94 meq) in methyl ethyl ketone (195 g) containing deionized water (1.1 g). The mixture was agitated on a shaker for 10–12 hours, after which time only a fine white precipitate of sodium bromide remained. The sodium bromide was allowed to settle. The sulfonated polyester (21.76 g) was formed in quantitative yield and comprised about 6.3% by weight tetrabutylammonium cations, 0.6% by weight sodium ions, and 93.1% by weight sulfonated polyester anions.

A portion of the foregoing solution (25.5 g), which contained 2.55 g (1.32 meq) of the tetrabutylammonium sulfopolyester salt, was added to 100 g of methyl ethyl ketone. Then 9.20 g (4.66 meq) of the 1:1 diazonium resin/sulfonated polyester adduct of Preparation 18, which is insoluble in methyl ethyl ketone, was dispersed in the solution. The resulting mixture was agitated on a shaker for 2–3 hours. During this time, the solution became clear and the adduct having Formula III (11.75 g) was formed in essentially quantative yield. The adduct consisted of 6.8% by weight diazonium resin cations, 1.4% by weight tetrabutylammonium cations, 0.1% by weight sodium ions, and 91.7% by weight sulfonated polyester anions.

To this solution, which contained the adduct (1.648 g), was added 12.0 g of methyl ethyl ketone and the following solutions: 6.75 g of a 10% solution of cellulose acetate butyrate in methyl ethyl ketone ("C-A-B 500-5", Eastman Chemical Company); 0.90 g of a 10.0% solution of 4-(phenylazo)diphenylamine in methyl ethyl ketone; 9.00 g of a 10% solution of oxalic acid in methyl ethyl ketone; 7.50 g of a 10% solution of polyvinylhydrogen phthalate in methyl ethyl ketone; 6.46 g of a 19.75% solution mill base containing 1.27 g of a mixture of 5 parts by weight Sunfast Blue 249-1284 pigment (Sun Chemical Corp.) and 1 part by weight vinyl chloride/vinyl acetate copolymer ("VYNS-3" resin, Union Carbide Corp.) in methyl ethyl ketone. A lithographic plate was coated by repeating the coating method of Example XII. The dry coating contained the following ingredients in the approximate amounts indicated: 78.3% by weight adduct having Formula III, 4.5% by weight cellulose acetate butyrate; 0.6% by weight 4-(phenylazo)diphenylamine; 3.0% by weight oxalic acid; 5.0% by weight polyvinyl hydrogenphthalate; and 8.5% by weight mill base. The plate was exposed and processed using the procedure of Examples XXVI–XXXVI. Some staining of the aluminum was observed in the background. Approximately six steps were reproduced in the photographic stepwedge. Staining was improved by the addition of small amounts of oxalic acid (1–2%) to the coating composition.

Various modifications and alterations of this invention will become apparent to those skilled in the art without departing from the scope and spirit of this invention, and it should be understood that this invention is not to be duly limited to the illustrated embodiments set forth herein.

What is claimed is:

1. An adduct consisting essentially of
   (a) a sulfonated polyester resin having a plurality of sulfonate groups, said polyester resin having a Tg of from about 25° C. to about 100° C. and a sulfonate equivalent weight of from about 1,500 to about 4,000, and
   (b) a diazonium resin having a plurality of diazonium groups, said adduct having stoichiometric one to one amounts of said plurality of sulfonate groups and plurality of diazonium groups, wherein
      (i) at least one of said plurality of sulfonate groups is ionically associated with at least one of said plurality of diazonium groups,
      (ii) at least one of said plurality of sulfonate groups is ionically associated with at least one tetrasubstituted quaternary ammonium cation or tetrasubstituted quaternary phosphonium cation, or both of the foregoing cations, wherein substitutents of said tetrasubstituted quaternary ammonium cation or said tetrasubstituted quaternary phosphonium cation are selected from the group consisting of alkyl groups, aryl groups, aralkyl groups, alkaryl groups, and combinations of these groups, and
      (iii) at least one of said plurality of diazonium groups is ionically associated with at least one acid anion.

2. The adduct of claim 1, wherein said sulfonated polyester resin (a) is present in an amount of from about 78 to about 95% by weight of said adduct, said diazonium resin (b) is present in an amount of from about 4 to about 11% by weight of said adduct, said quaternary ammonium cation or said tetrasubstituted quaternary phosphonium cation is present in an amount of from about 0.3 to about 10% by weight of said adduct, and said acid anion is present at in an amount of from about 0.2 to about 4% by weight of said adduct.

3. The adduct of claim 1, wherein said sulfonated polyester resin (a) has a sulfonate equivalent weight of from about 2,000 to about 3,000 and a molecular weight of from about 30,000 to about 40,000.

4. The adduct of claim 1, wherein said diazonium resin (b) is the condensation product of 4-diazodiphenylamine and an aldehyde compound.

5. The adduct of claim 4, wherein said aldehyde compound is formaldehyde.

6. The adduct of claim 1, wherein said quaternary cation has a molecular weight of from about 100 to about 600.

7. The adduct of claim 1, wherein said quaternary cation has a molecular weight of from about 200 to about 400.

8. A radiation-sensitive article comprising a substrate having coated on one surface thereof a light sensitive coating composition comprising an effective amount of an adduct consisting essentially of
   (a) a sulfonated polyester resin having a plurality of sulfonate groups, said polyester resin having a Tg of from about 25° C. to about 100° C. and a sulfonate equivalent weight of from about 1,500 to about 4,000, and
   (b) a diazonium resin having a plurality of diazonium groups, said adduct having stoichiometric one to one amounts of said plurality of sulfonate groups and plurality of diazonium groups, wherein
      (i) at least one of said plurality of sulfonate groups is ionically associated with at least one of said plurality of diazonium groups,
      (ii) at least one of said plurality of sulfonate groups is ionically associated with at least one tetrasubstituted quaternary ammonium cation or a tetrasubstituted quaternary phosphonium cation, or both of the foregoing cations, wherein substitutents of said tetrasubstituted quaternary ammonium cation or said tetrasubstituted quaternary phosphonium cation are selected from the group consisting of alkyl groups, aryl groups, aralkyl groups, alkaryl groups, and combinations of these groups, and
      (iii) at least one of said plurality of diazonium groups is ionically associated with at least one acid anion.

9. The article of claim 8, wherein said light-sensitive coating composition further includes a polymer having carboxylic acid groups, said polymer being present in a concentration of less than about 10% by weight of said coating, said polymer having an equivalent weight of from about 200 to about 2,000.

10. The article of claim 8, wherein said light-sensitive coating composition further includes a polymer selected from the group consisting of cellulose acetate trimellitate, cellulose acetate phthalate, and polyvinyl hydrogen phthalate, said polymer being present at a concentration of less than about 10% by weight of said coating.

11. An adduct consisting essentially of
    (a) a sulfonated polyester resin having a plurality of sulfonate groups, said polyester resin having a Tg of from about 25° C. to about 100° C. and a sulfonate equivalent weight of from about 1,500 to about 4,000, and
    (b) a diazonium resin having a plurality of diazonium groups, said adduct having stoichiometric one to one amounts of said plurality of sulfonate groups and plurality of diazonium groups, wherein
       (i) at least one of said plurality of sulfonate groups is ionically associated with at least one of said plurality of diazonium groups, and
       (ii) at least one of said plurality of sulfonate groups is ionically associated with at least one tetrasubstituted quaternary ammonium cation or a tetrasubstituted quaternary phosphonium cation, or both of the foregoing cations, wherein substitutents of said tetrasubstituted quaternary ammonium cation or said tetrasubstituted quaternary phosphonium cation are selected from the group consisting of alkyl groups, aryl groups, aralkyl groups, alkaryl groups, and combinations of these groups.

12. The adduct of claim 11, wherein said sulfonated polyester resin (a) is present in an amount of from about 80 to about 96% by weight of said adduct, said diazonium resin (b) is present in an amount of from about 2.5 to about 10% by weight of said adduct, said tetrasubstituted quaternary ammonium cation or said tetrasubstituted quaternary phosphonium cation is present in an amount of from about 0.4 to about 12% by weight of said adduct.

13. The adduct of claim 11, wherein said sulfonated polyester resin (a) has a sulfonate equivalent weight of from about 2,000 to about 3,000 and a molecular weight of from about 30,000 to about 40,000.

14. The adduct of claim 11, wherein said diazonium resin (b) is the condensation product of 4-diazodiphenylamine and an aldehyde compound.

15. The adduct of claim 14, wherein said aldehyde compound is formaldehyde.

16. The adduct of claim 11, wherein said quaternary cation has a molecular weight of from about 100 to about 600.

17. The adduct of claim 11, wherein said quaternary cation has a molecular weight of from about 200 to about 400.

18. The adduct of claim 11, wherein said quaternary cation has a molecular weight of from about 100 to about 600.

19. The adduct of claim 11, wherein said quaternary cation has a molecular weight of from about 200 to about 400.

20. A radiation-sensitive article comprising a substrate having coated on one surface thereof a light sensitive coating composition comprising an effective amount of an adduct consisting essentially of
(a) a sulfonated polyester resin having a plurality of sulfonate groups, said polyester resin having a Tg of from about 25° C. to about 100° C. and a sulfonate equivalent weight of from about 1,500 to about 4,000, and
(b) a diazonium resin having a plurality of diazonium groups, said adduct having stoichiometric one to one amounts of said plurality of sulfonate groups and plurality of diazonium groups, wherein
  (i) at least one of said plurality of sulfonate groups is ionically associated with at least one of said plurality of diazonium groups, and
  (ii) at least one of said plurality of sulfonate groups is ionically associated with at least one tetrasubstituted quaternary ammonium cation or a tetrasubstituted quaternary phosphonium cation, or both of the foregoing cations, wherein substitutents of said tetrasubstituted quaternary ammonium cation or said tetrasubstituted quaternary phosphonium cation are selected from the group consisting of alkyl groups, aryl groups, aralkyl groups, alkaryl groups, and combinations of these groups.

21. The article of claim 20, wherein said light sensitive coating composition further includes a polymer having carboxylic acid groups, said polymer being present at a concentration of less than about 10% by weight of said coating, said polymer having an equivalent weight of from about 200 to about 2,000.

22. The article of claim 20, wherein said light-sensitive coating composition further includes a polymer selected from the group consisting of cellulose acetate trimellitate, cellulose acetate phthalate, and polyvinyl hydrogen phthalate, said polymer being present at a concentration of less than about 10% by weight of said coating.

23. An adduct consisting essentially of
(a) a sulfonated polyester resin having a plurality of sulfonate groups, said polyester resin having a Tg of from about 25° C. to about 100° C. and a sulfonate equivalent weight of from about 1,500 to about 4,000, and
(b) a diazonium resin having a plurality of diazonium groups, said adduct having stoichiometric one to one amounts of said plurality of sulfonate groups and plurality of diazonium groups, wherein
  (i) at least one of said plurality of sulfonate groups is ionically associated with at least one of said plurality of diazonium groups,
  (ii) at least one of said plurality of sulfonate groups is ionically associated with at least one tetrasubstituted quaternary ammonium cation or a tetrasubstituted quaternary phosphonium cation, or both of the foregoing cations, wherein substitutents of said tetrasubstituted quaternary ammonium cation or said tetrasubstituted phosphonium cation are selected from the group consisting of alkyl groups, aryl groups, aralkyl groups, alkaryl groups, and combinations of these groups, and
  (iii) at least one of said plurality of sulfonate groups is ionically associated with at least one alkali metal cation.

24. The adduct of claim 23, wherein said sulfonated polyester resin (a) is present in an amount of from about 85 to about 97% by weight of said adduct, said diazonium resin (b) is present in an amount of from about 3.5 to about 10% by weight of said adduct, said tetrasubstituted quaternary ammonium cation or said tetrasubstituted quaternary phosphonium cation is present in an amount of from about 0.04 to about 6% by weight of said adduct, and said alkali metal cation is present in an amount of from about 0.03 to about 0.5% by weight of said adduct.

25. The adduct of claim 23, wherein said sulfonated polyester resin (a) has a sulfonate equivalent weight of from about 2,000 to about 3,000 and a molecular weight of from about 30,000 to about 40,000.

26. The adduct of claim 23, wherein said diazonium resin (b) is the condensation product of 4-diazodiphenylamine and an aldehyde compound.

27. The adduct of claim 26, wherein said aldehyde compound is formaldehyde.

28. A radiation-sensitive article comprising a substrate having coated on one surface thereof a light sensitive coating composition comprising an effective amount of an adduct consisting essentially of
(a) a sulfonated polyester resin having a plurality of sulfonate groups, said polyester resin having a Tg of from about 25° C. to about 100° C. and a sulfonate equivalent weight of from about 1,500 to about 4,000, and
(b) a diazonium resin having a plurality of diazonium groups, said adduct having stoichiometric one to one amounts of said plurality of sulfonate groups and plurality of diazonium groups, wherein
  (i) at least one of said plurality of sulfonate groups is ionically associated with at least one of said plurality of diazonium groups,
  (ii) at least one of said plurality of sulfonate groups is ionically associated with at least one tetrasubstituted quaternary ammonium cation or a tetrasubstituted quaternary phosphonium cation, or both of the foregoing cations, wherein substitutents of said tetrasubstituted quaternary ammonium cation or said tetrasubstituted quaternary phosphonium are selected from the groups consisting of alkyl groups, aryl groups, aralkyl groups, alkaryl groups, and combinations of these groups, and
  (iii) at least one of said plurality of sulfonate groups is ionically associated with at least one alkali metal cation.

29. The article of claim 28, wherein said light sensitive coating composition further includes a polymer having carboxylic acid groups, said polymer being present at a concentration of less than about 10% by weight of said coating, said polymer having an equivalent weight of from about 200 to about 2,000.

30. The article of claim 28, wherein said light-sensitive coating composition further includes a polymer selected from the group consisting of cellulose acetate trimellitate, cellulose acetate phthalate, and polyvinyl hydrogen phthalate, said polymer being present at a concentration of less than about 10% by weight of said coating.

* * * * *